United States Patent [19]
Peana et al.

[11] Patent Number: 6,111,761
[45] Date of Patent: Aug. 29, 2000

[54] ELECTRONIC ASSEMBLY

[75] Inventors: Stefan Peana; Boon Hua How; Janto Tjandra, all of Singapore, Singapore

[73] Assignee: Motorola, Inc., Schaumburg, Ill.

[21] Appl. No.: 09/378,942

[22] Filed: Aug. 23, 1999

[51] Int. Cl.[7] ................................. H05K 9/00
[52] U.S. Cl. .................. 361/818; 361/816; 361/760; 361/767; 361/783; 361/820; 174/35 R; 174/52.2; 174/52.4; 257/659; 257/660; 257/734; 257/737; 257/738; 257/780; 257/781; 257/782
[58] Field of Search ................... 361/818, 816, 361/760, 767, 783, 820; 174/35 R, 52.4, 52.2; 257/659–660, 734, 737–738, 780–782

[56] References Cited

U.S. PATENT DOCUMENTS

| | | | |
|---|---|---|---|
| 5,311,059 | 5/1994 | Banerji et al. ......................... 257/778 |
| 5,311,402 | 5/1994 | Kobayashi et al. ..................... 361/760 |
| 5,406,027 | 4/1995 | Matsumoto et al. .................... 174/52.2 |
| 5,666,008 | 9/1997 | Tomita et al. ........................... 257/778 |
| 5,910,641 | 6/1999 | Gaynes et al. .......................... 174/52.4 |

*Primary Examiner*—Leo P. Picard
*Assistant Examiner*—Tuan Dinh
*Attorney, Agent, or Firm*—Philip P. Macnak

[57] ABSTRACT

An electronic assembly (1) having at least one semiconductor die (2) with external electrodes (3) has a foldable electrically insulating substrate (4) supporting a plurality of conductive leads (5) connected and mounted to respective ones of the electrodes (3). A plurality of external connectors (11) supported by the substrate (4) are electrically coupled to respective ones of the leads (5). The substrate (4) is folded at least once into a folded position to form at least two opposite facing surfaces (8, 9) with an adhesive and the die (2) at least partially sandwiched therebetween. The adhesive bonding the substrate (4) to the die (2) maintains the substrate (4) in the folded position.

12 Claims, 4 Drawing Sheets

ELECTRONIC ASSEMBLY

FIELD OF THE INVENTION

This invention relates to an electronic assembly with a foldable substrate. The invention is particularly useful for, but not necessarily limited to, surface mountable electronic assemblies.

BACKGROUND ART

Ever increasing requirements for reducing the size of packaged semiconductor devices has led to the development of several different types of semiconductor packages. As examples of indicative prior art, reference may be had to United States patent identified by U.S. Pat. No. 5,355,283. This patent describes a ball grid array in which one or more vias are formed through a substrate to electrically interconnect conductive leads formed on another surface of the substrate.

Another example is found in United States patent identified by U.S. Pat. No. 5,397,921. This patent describes a grid array package for an integrated circuit. This package has a tape substrate bearing a pattern of conductive leads radially emanating from a die aperture to connect to an area array of pads arranged on the tape perimeter.

Reference may also be had to United States patent identified by U.S. Pat. No. 5,541,450 which describes a ball grid array semiconductor package with a semiconductor die attached to a support substrate within the opening in the substrate. Bond pads on the chip are electrically connected to ball pads on the lower surface of the substrate.

Generally speaking, reduced sizes of semiconductor devices use an inverted die that is directly attached to a substrate to thereby increase the density of external connections that are provided within the perimeter of the package.

The inverted die, when assembled to form a semiconductor package is known in the art as a flip chip semiconductor package, sometimes comprises a flexible and foldable tape substrate with a pattern of runners with corresponding outer portions that are made available for interconnection to, for example, a printed circuit board. The inverted die is mounted to the substrate and the runners are connected, typically by solder, to pads on the die. With this package a relatively high density of runners can be formed on the flexible and foldable tape substrate to provide a higher density of external connections. The flip chip semiconductor package with the flexible and foldable tape substrate is becoming a popular alternative to the conventional more rigid substrate packages.

Currently, flip chip semiconductor packages are manufactured such that after the die is mounted to the flexible substrate to form an assembly. The assembly is preheated then an underfill material is dispensed onto the assembly into a gap between the substrate and die.

Unfortunately, the increasing requirements for reducing the size of packaged semiconductor devices cannot always be adequately met by the prior art. For instance, when considering flip chip packages using flexible and foldable tape substrates, the runners that couple electrodes of the die to ball grid array connectors can make the perimeter mounting area of the package unsuitably large. If the length of the runners were decreased then this would reduced the size of the mounting area, however the runners must have sufficient length so as to provide interconnects between the pattern of external die electrodes and the ball grid array connectors. Further, conventional flip chip packages using flexible and foldable tape substrates do not always adequately provide enough rigidity to allow for reducing stress that may occur on the ball grid array connectors. It would also be beneficial if the prior art packages had a means of physically protecting the die, without the need for a moulded housing, and it would be useful to have an integral radio frequency shield for providing protection when such packages are subject to electro magnetic waves.

SUMMARY OF THE INVENTION

It is an object of the present invention to overcome or alleviate at least one of the problems associated with prior art semiconductor packages or at least provide the public with a useful alternative.

According to one aspect of the invention there is provided an electronic assembly comprising:

at least one semiconductor die having external electrodes;
  a foldable electrically insulating substrate supporting a plurality of conductive leads, said leads being electrically connected and mounted to respective ones of said electrodes; and
  a plurality of external connectors supported by said substrate, said connectors being electrically coupled to respective ones of said leads;
  wherein said substrate is folded at least once to form at least two opposite facing surfaces with an adhesive at least partially sandwiched therebetween.

Preferably, said adhesive is an underfill material.

Suitably, said die is mounted on an upper outer surface of said substrate, said underfill material fills a void between inner facing surfaces of said substrate, and at least some of said external connectors are on a lower outer surface of said substrate.

In one alternative preferable form, at least part of said die is sandwiched between said substrate.

Suitably, said substrate is a tape substrate.

Preferably, said substrate includes a radio frequency shield.

Suitably, said radio frequency shield is a conductive sheet supported by said substrate.

Suitably, said external connectors protrude from both an outer upper and outer lower facing surfaces of said substrate.

Preferably, said external connectors are in the form of a ball grid array.

BRIEF DESCRIPTION OF THE DRAWINGS

In order that the present invention may be readily understood and put into practical effect, reference will now be made to preferred embodiments illustrated in the accompanying drawings in which.

DETAILED DESCRIPTION OF THE PREFERRED EMBODIMENTS OF THE INVENTION

Figure 1:
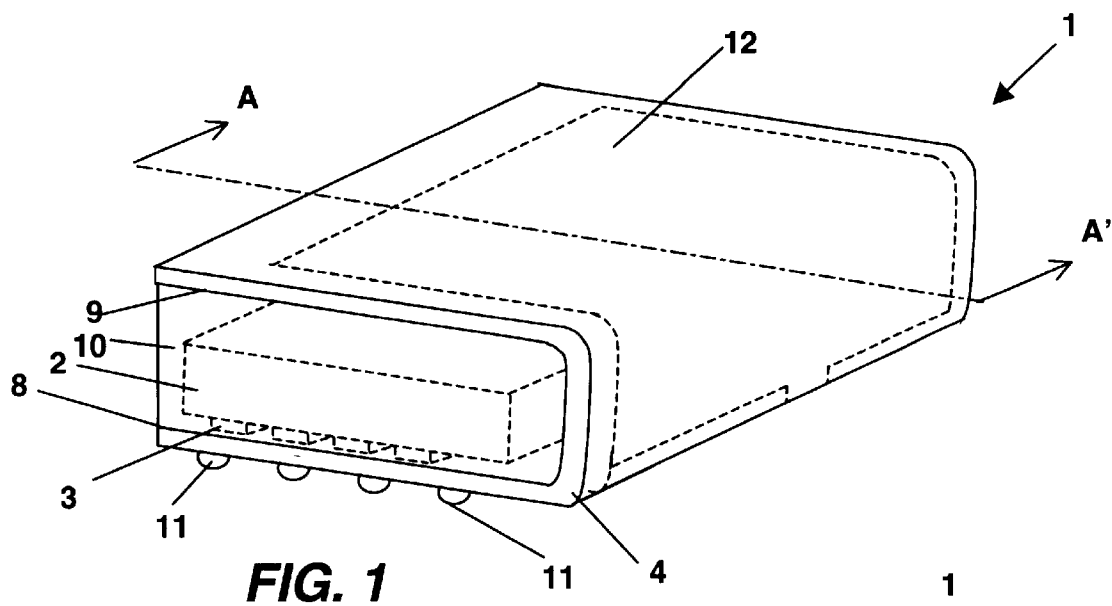
FIG. 1. is a perspective view of an electronic assembly in accordance with a first embodiment of the invention.
Figure 2:
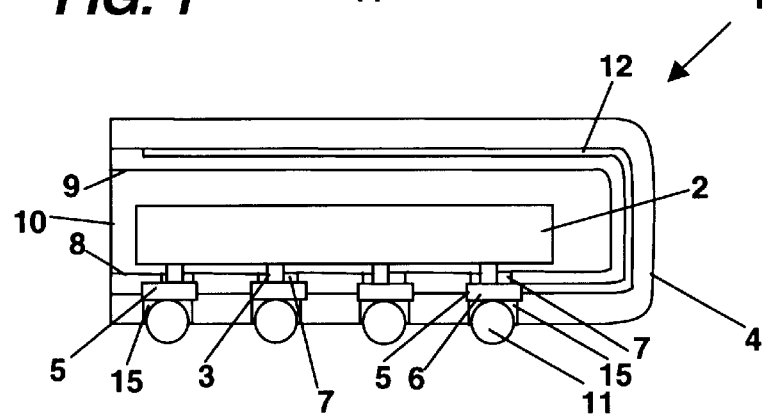
FIG. 2. illustrates a cross sectional side view through A–A' of the electronic assembly of FIG. 1.

Referring to FIGS. 1 and 2 there is illustrated a first embodiment of an electronic assembly 1 comprising a semiconductor die 2 having external electrodes 3. The electronic assembly 1 has a foldable electrically insulating substrate known in the art as a tape substrate 4 that support, cover and insulate a plurality of electrically conductive leads 5. The conductive leads 5 have pads 6 and respective apertures 7 in the substrate 4 allow for electrical connection and mounting of pads 6 to aligned respective electrodes 3 by, for example, solder bonding. The electronic assembly 1 also includes external connectors in the form of solder balls 11 inserted into apertures 15 in tape substrate 4 to thereby allow electrical coupling and mounting of solder balls 11 to respective leads 5. Accordingly, the solder balls 11 in this embodiment form a ball grid array as will be apparent to a person skilled in the art.

The tape substrate 4 is folded to form two opposite facing surfaces 8,9 and an adhesive in the form of an underfill material 10, typically an epoxy resin, is sandwiched between surfaces 8,9. As illustrated in this embodiment the die 2 is also sandwiched between surfaces 8,9 of substrate 4. Further, a radio frequency shield 12 is provided in substrate 4, this shield is a typically a copper sheet supported by the substrate 4 and as illustrated the shield 12 is electrically coupled to an external electrode 3 of the die 2. If appropriate, the shield 12, as illustrated, is directly electrically coupled to a one or more of the solder balls 11.

Figure 3:
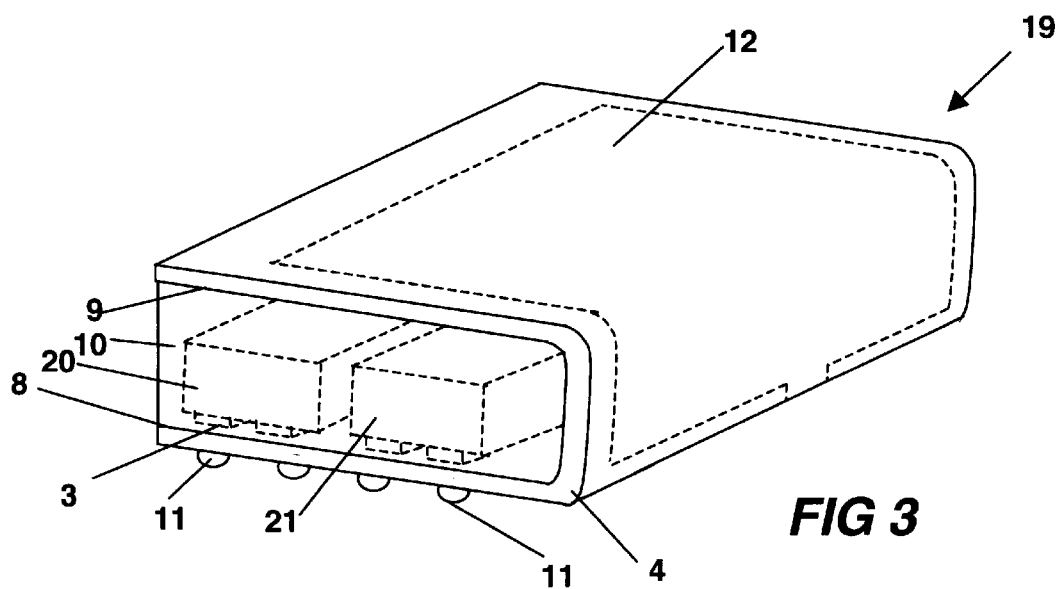
FIG. 3 is a perspective view of an electronic assembly in accordance with a second embodiment of the invention.

Referring to FIG. 3 a second embodiment of an electronic assembly 19 is illustrated in which there are two semiconductor dies 20,21 sandwiched between surfaces 8,9 of the tape substrate 4. All other components of the assembly are similar to that of FIGS. 1 and 2 as will be apparent to a person skilled in the art and to avoid repetition are not described further.

Figure 4:
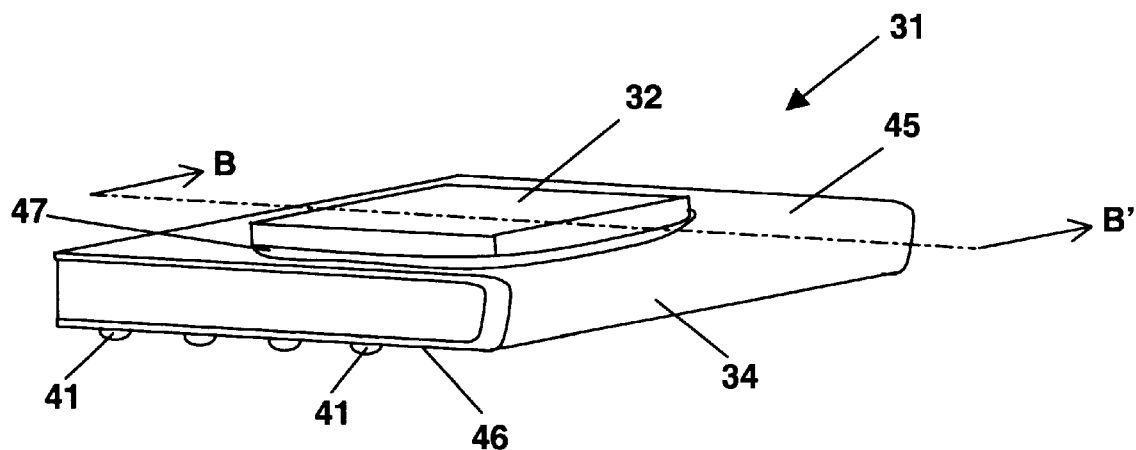
FIG. 4 is a perspective view of an electronic assembly in accordance with a third embodiment of the invention.
Figure 5:
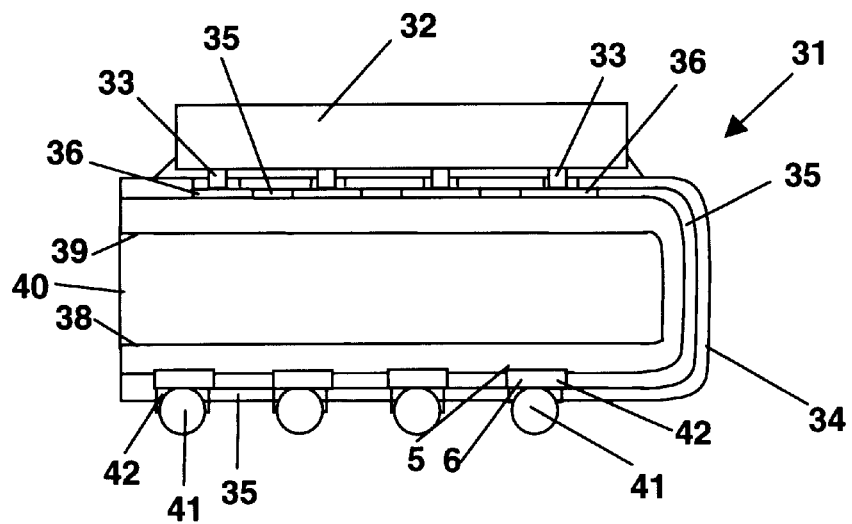
FIG. 5 illustrates a cross sectional side view through B–B' of the electronic assembly of FIG. 4.

Referring to FIGS. 4 and 5 there is illustrated a third embodiment of an electronic assembly 31 comprising a semiconductor die 32 having external electrodes 33. The electronic assembly 31 has a foldable electrically insulating tape substrate 34 that support, cover and insulate a plurality of electrically conductive leads 35. The conductive leads 35 have pads 36 and respective apertures 37 in the substrate 34 allow for electrical connection and mounting of pads 36 to aligned respective electrodes 33 typically by solder bonding. The electronic assembly 31 also includes external connectors in the form of solder balls 41 inserted into apertures 42 in tape substrate 34 to allow electrical coupling and mounting of solder balls 41 to respective leads 35 thereby forming a ball grid array.

The tape substrate 34 is folded to form two opposite facing surfaces 38,39 and an adhesive in the form of an underfill material 40, typically an epoxy resin, is sandwiched between surfaces 38,39 thereby filling a void therebetween. As illustrated in this embodiment the die 32 is mounted on an upper outer surface 45 of substrate 34. Further, solder balls 41 are located on a lower outer surface 46 of substrate 34 and more underfill material 47 is provided between upper outer surface 45 and a facing surface of the die 32.

Figure 6:
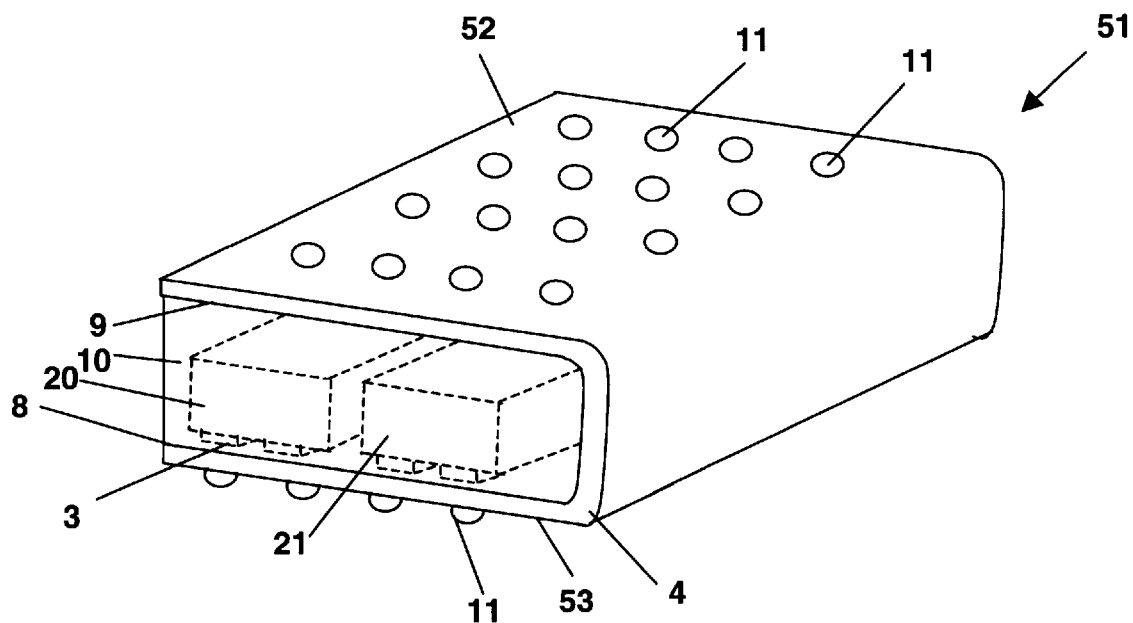
FIG. 6 is a perspective view of an electronic assembly in accordance with a fourth embodiment of the invention.

Referring to FIG. 6 there is illustrated a fourth embodiment of an electronic assembly 51 that is similar to the assembly of FIG. 3 except that the balls 11 are located on both a upper 52 and lower 53 outer surface of substrate 4. All other components of the assembly are similar to that of FIGS. 1 and 2 as will be apparent to a person skilled in the art and to avoid repetition are not described further.

Figure 7:
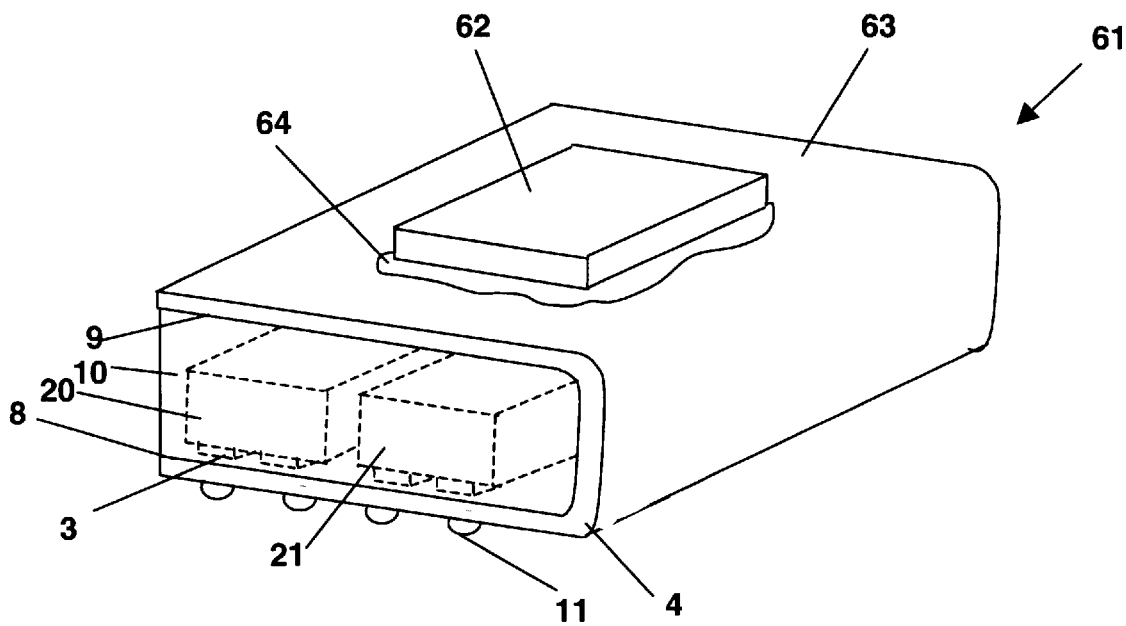
FIG. 7 is a perspective view of an electronic assembly in accordance with a fifth embodiment of the invention.

Referring to FIG. 7 there is illustrated a fifth embodiment of an electronic assembly 61 that is similar to the assembly of FIG. 3 except that there is now a further semiconductor die 62 located on an upper outer surface 63 of substrate 4. More underfill material 64 is provided between upper outer surface 63 and a facing surface of the die 62. Again all other components of the assembly 61 are similar to that of FIGS. 1 and 2 and to avoid repetition are not described further.

Figure 8:
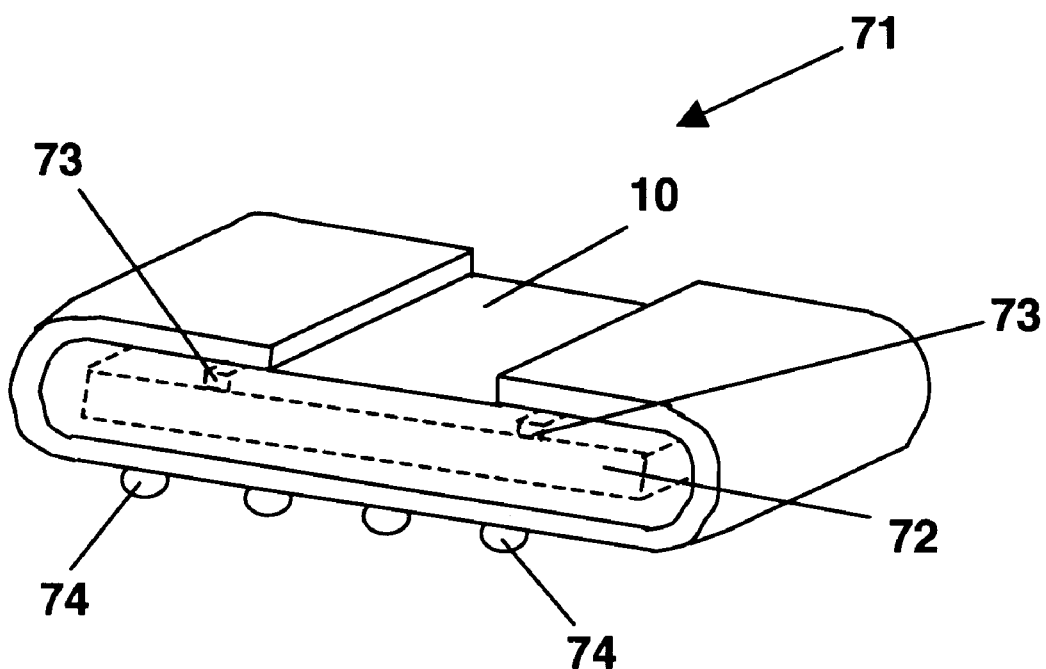
FIG. 8 is a perspective view of an electronic assembly in accordance with a sixth embodiment of the invention.

Referring to FIG. 8 a sixth embodiment of the invention is illustrated in which an electronic assembly 71 comprises a semiconductor die 72 having external electrodes 73 that are coupled by conductive leads to respective solder balls 74. To avoid repetition the conductive leads and description of interconnects and underfill material 10 are not repeated as they will be evident to a person skilled in the art and are described above with reference to FIGS. 1 and 2.

Advantageously, the present invention, as described in all the above embodiments, allows for a cost effective reduction in perimeter mounting areas. This is because the folding the tape substrate allows for the total surface area enclosed by the perimeter of the electronic assembly to be made to be only slightly larger than the semiconductor die 2 or dies 20,21. As a result, larger substrates 4 can be used and the extra space allows for adequate interconnects by conductive leads 6 between the pattern of external die electrodes 3 and the solder balls 11 forming a ball grid array. Further, the folding of the tape substrate and use of underfill material as an adhesive provides sufficient rigidity to allow for reducing stress that may occur on the solder balls 11 forming a ball grid array of connectors.

Another advantage is that the present invention physically protects the die tape substrate 4 at least partially surrounds the die 2 or dies 20,21, and therefore provides some protection. Finally, in the embodiments of FIGS. 1 to 5, an integral radio frequency shield 12 advantageously provides cost effective shielding.

Although the invention has been described with reference to preferred embodiments it is to be understood that the invention is not restricted to the embodiments described herein.

We claim:

1. An electronic assembly comprising:
   at least one semiconductor die having external electrodes;
   a foldable electrically insulating substrate supporting a plurality of conductive leads, said leads being electrically connected and mounted to respective ones of said electrodes; and
   a plurality of external connectors supported by said substrate, said connectors being electrically coupled to respective ones of said leads;
   wherein said substrate is folded at least once into a folded position to form at least two opposite facing surfaces with an adhesive and said die at least partially sandwiched therebetween, said adhesive bonding said substrate to said die thereby maintaining said substrate in said folded position.

2. An electronic assembly as claimed in claim 1, wherein said adhesive is an underfill material.

3. An electronic assembly as claimed in claim 1, wherein said die is mounted on an upper outer surface of said substrate, said underfill material fills a void between inner facing surfaces of said substrate, and at least some of said external connectors are on a lower outer surface of said substrate.

4. An electronic assembly as claimed in claim 1, wherein at least part of said die is sandwiched between said substrate.

5. An electronic assembly as claimed in claim 1, wherein said substrate is a tape substrate.

6. An electronic assembly as claimed in claim 4, wherein said substrate is a tape substrate.

7. An electronic assembly as claimed in claim 4, wherein said substrate is a tape substrate and said substrate includes a radio frequency shield.

8. An electronic assembly as claimed in claim 6, wherein said substrate is a tape substrate and said substrate includes a radio frequency shield.

9. An electronic assembly as claimed in claim 7, wherein said radio frequency shield is a conductive sheet supported by said substrate.

10. An electronic assembly as claimed in claim 9, wherein said radio frequency shield is a conductive sheet supported by said substrate.

11. An electronic assembly as claimed in claim 1, wherein said external connectors protrude from both an outer upper and outer lower facing surfaces of said substrate.

12. An electronic assembly as claimed in claim 11, wherein said external connectors are in the form of a ball grid array.

* * * * *